(12) United States Patent
Palikaras et al.

(10) Patent No.: US 9,791,724 B2
(45) Date of Patent: Oct. 17, 2017

(54) OPTICAL DIODE COMPRISING COMPONENTS MADE FROM METAMATERIALS

(71) Applicant: Lamda Guard Technologies Ltd., London (GB)

(72) Inventors: George Palikaras, London (GB); Themos Kallos, London (GB)

(73) Assignee: Lamda Guard Technologies Ltd., London (GB)

( * ) Notice: Subject to any disclaimer, the term of this patent is extended or adjusted under 35 U.S.C. 154(b) by 181 days.

(21) Appl. No.: 14/778,878

(22) PCT Filed: Mar. 20, 2014

(86) PCT No.: PCT/GB2014/050873
§ 371 (c)(1),
(2) Date: Sep. 21, 2015

(87) PCT Pub. No.: WO2014/147402
PCT Pub. Date: Sep. 25, 2014

(65) Prior Publication Data
US 2016/0048043 A1    Feb. 18, 2016

(30) Foreign Application Priority Data

Mar. 22, 2013   (GB) .................................. 1305334.3

(51) Int. Cl.
*G02B 1/00* (2006.01)
*G02B 5/30* (2006.01)
(Continued)

(52) U.S. Cl.
CPC ............ *G02F 1/093* (2013.01); *G02B 1/002* (2013.01); *G02B 5/008* (2013.01); *G02B 5/3016* (2013.01);
(Continued)

(58) Field of Classification Search
None
See application file for complete search history.

(56) References Cited

U.S. PATENT DOCUMENTS 4,844,593 A      7/1989   Parker
6,927,909 B2 *   8/2005   Minemoto ............ G02F 1/0036
                                                              359/282
(Continued)

FOREIGN PATENT DOCUMENTS

EP           0 326 323 A2    2/1989
EP           1 298 939 A2    4/2003
WO       WO 2012/155475 A1  11/2012

OTHER PUBLICATIONS

Azzam et al., "Circular Polarization Beam Splitter That Uses Frustrated Total Internal Reflection by an Embedded Symmetric Archiral Multilayer Coating," Optics Letters, vol. 28, No. 5, dated Mar. 1, 2003, pp. 355-357.
(Continued)

*Primary Examiner* — Derek S Chapel
(74) *Attorney, Agent, or Firm* — McDonnell Boehnen Hulbert & Berghoff LLP

(57) ABSTRACT

There is provided an optical diode comprising a circular polarisation splitter, a first circular polariser and a second circular polariser. The circular polarisation splitter is arranged to receive at least partially unpolarised light and output right-handed circular polarised light along a first optical path and left-handed circular polarised light along a second optical path. The first circular polariser is arranged on the first optical path and transmits right-handed circular polarised light and reflects left-handed circular polarised light. The second circular polariser is arranged on the second optical path and transmits left-handed circular polarised light and reflects right-handed circular polarised light.

28 Claims, 5 Drawing Sheets

(51) Int. Cl.
*G02B 27/28* (2006.01)
*G02F 1/09* (2006.01)
*G02F 1/01* (2006.01)
*H01L 31/054* (2014.01)
*G02B 5/00* (2006.01)

(52) U.S. Cl.
CPC ........... *G02B 5/3025* (2013.01); *G02B 27/28* (2013.01); *G02B 27/283* (2013.01); *G02F 1/0136* (2013.01); *H01L 31/0547* (2014.12); *Y02E 10/52* (2013.01)

(56) References Cited

U.S. PATENT DOCUMENTS

| | | | |
|---|---|---|---|
| 6,977,763 B1 * | 12/2005 | Wang | G02B 27/286 |
| | | | 359/238 |
| 2003/0090618 A1 * | 5/2003 | Kashima | G02B 5/3016 |
| | | | 349/194 |
| 2005/0073744 A1 | 4/2005 | Zheludev et al. | |
| 2006/0262398 A1 | 11/2006 | Sangu et al. | |
| 2009/0128908 A1 | 5/2009 | Nakazawa et al. | |
| 2009/0168613 A1 | 7/2009 | Sirat | |
| 2012/0162646 A1 * | 6/2012 | Holzapfel | G01D 5/38 |
| | | | 356/369 |

OTHER PUBLICATIONS

Gevorgyan et al., "Accumulation and Transmission of the Light Energy in Nonreciprocal Multilayer Systems," Optics Communications, Noth-Holland Publishing Co., Vo. 259, No. 2, dated Mar. 15, 2006, pp. 455-464.

Nersisyan et al., "The Principles of Laser Beam Control with Polarization Gratings Introduced as Diffractive Waveplates," Proceedings of SPIE, vol. 7775, dated Dec. 31, 2010.

Tabiryan et al., "Trnasparent Thin Film Polarizing and Optical Control Systems," AIP Advances, vol. 1, No. 2, dated Jan. 1, 2011, 12 pages.

Thiel et al., "Chiral 3D Photonic Crystals as Compact Optical Isolators," CLEO '07 2007 Conference on Lasers and Electro-Optics May 5-11, 2007, 2 pages.

International Search Report issued in International Patent Application No. PCT/GB2014/050873, European Patent Office, dated Jun. 16, 2014, 6 pages.

Written Opinion issued in International Patent Application No. PCT/GB2014/050873, European Patent Office, dated Jun. 16, 2014, 8 pages.

* cited by examiner

OPTICAL DIODE COMPRISING COMPONENTS MADE FROM METAMATERIALS

CROSS-REFERENCE TO RELATED APPLICATIONS

This application is a U.S. National Stage application under 35 U.S.C. 371 of International Patent Application no. PCT/GB2014/050873, filed Mar. 20, 2014, which claims the benefit of priority of United Kingdom Patent Application no. GB 1305334.3, filed Mar. 22, 2013.

FIELD

The present disclosure relates to an optical diode and a photovoltaic device. The present disclosure also relates to a metamaterial, more specifically, an optical metamaterial. The present disclosure also relates to a liquid crystal, more specifically, a cholesteric liquid crystal. Embodiments relate to a circular polariser and a circular polarisation splitter. Further embodiments of the present disclosure relate to a metamaterial component or layer, or combination of metamaterial layers, for increasing the efficiency of a photovoltaic device.

BACKGROUND

Global photovoltaic (PV) energy generation capacity grew fivefold to 35 gigawatts between 2007 and 2010, with 75% of the capacity available in Europe. Most PV technologies today are based on crystalline silicon (Si) wafers, with organic PVs largely being regarded as a far-in-the-future option. While silicon absorbs solar light effectively in most of the visible range (350-600 nanometers), it behaves poorly between 600-1,100 nm. In order to compensate for this weak absorption, most PV cells have Si wafer thicknesses between 200-300 nm, and are typically referred to as "optically thick" absorbers. In addition, a pyramidal surface texture is typically utilized in order to scatter incoming light over a wide range of angles, thus increasing the effective path length of the light cell.

However, these approaches have had a significant impact on the basic cost of PV cells as more materials and processing is required. Furthermore, for thick solar cells the photocarrier diffusion length is comparably short, and thus charge carriers generated away from the semiconductor junctions are not effectively collected. This has prevented PV technology from replacing conventional fossil fuel technologies for energy generation. Any technological development that could decrease the cost of PV cells by at least a factor of two would be a straightforward revolution in the industry. Such a development could be achieved by increasing the absorption efficiency of a solar cell, so that near-complete light absorption occurs along with photocarrier current collection.

Some techniques that utilize plasmonics have been investigated so far for increased efficiency, which are targeted towards creating thin-film solar cells with thicknesses 1-2 micrometers ($\mu m$). For example, by doping the semiconductor material with 20-100 nm diameter metallic nanoparticles, the particles can act as subwavelength scattering elements or near-field couplers for the incident solar radiation, increasing the effective scattering cross section.

Another method involves the coupling of incident solar radiation into surface plasmon polaritons (SPPs), which are electromagnetic waves that travel along the interfaces of metals and dielectrics. This SPP coupling can be achieved for example by corrugating the metallic back surface of the solar cell. In all these cases, one of the main challenges which remains is that the absorption in the semiconductor material needs to be higher than the plasmon losses in the metal. However, these losses become significant for solar wavelengths beyond 800 nm.

It should be emphasized that enhancing the absorption efficiency of weakly lossy materials offers a double advantage, as not only smaller quantities of absorbing materials can be used, but they can also be of inferior quality, thus in both cases reducing the overall cost of the device.

Some embodiments of the present disclosure relate to using metamaterials and metamaterial-based configurations to address these problems.

Metamaterials are artificially created materials that can achieve electromagnetic properties that do not occur naturally, such as negative index of refraction or electromagnetic cloaking. While the theoretical properties of metamaterials were first described in the 1960s, in the past 15 years there have been significant developments in the design, engineering and fabrication of such materials. A metamaterial typically consists of a multitude of unit cells, i.e. multiple individual elements (sometimes refer to as "meta-atoms") that each has a size smaller than the wavelength of operation. These unit cells are microscopically built from conventional materials such as metals and dielectrics. However, their exact shape, geometry, size, orientation and arrangement can macroscopically affect light in an unconventional manner, such as creating resonances or unusual values for the macroscopic permittivity and permeability.

Some examples of available metamaterials are negative index metamaterials, chiral metamaterials, plasmonic metamaterials, photonic metamaterials, etc. Due to their sub wavelength nature, metamaterials that operate at microwave frequencies have a typical unit cell size of a few millimetres, while metamaterials operating at the visible part of the spectrum have a typical unit cell size of a few nanometres. Some metamaterials are also inherently resonant, i.e. they can strongly absorb light at certain narrow range of frequencies.

For conventional materials the electromagnetic parameters such as magnetic permeability and electric permittivity arise from the response of the atoms or molecules that make up the material to an electromagnetic wave being passed through. In the case of metamaterials, these electromagnetic properties are not determined at an atomic or molecular level. Instead these properties are determined by the selection and configuration of a collection of smaller objects that make up the metamaterial. Although such a collection of objects and their structure do not "look" at an atomic level like a conventional material, a metamaterial can nonetheless be designed so that an electromagnetic wave will pass through as if it were passing through a conventional material. Furthermore, because the properties of the metamaterial can be determined from the composition and structure of such small (nanoscale) objects, the electromagnetic properties of the metamaterial such as permittivity and permeability can be accurately tuned on a very small scale.

One particular sub-field of metamaterials are plasmonic materials, which support oscillations of electrical charges at the surfaces of metals at optical frequencies. For example, metals such as silver or gold naturally exhibit these oscillations, leading to negative permittivity at this frequency range, which can be harnessed to produce novel devices such as microscopes with nanometer-scale resolution, nanolenses, nanoantennas, and cloaking coatings.

SUMMARY

Aspects of the present disclosure are defined in the appended independent claims.

The present disclosure details the design of an optical diode using effects achieved with circular polarisation. More specifically, the present disclosure relates to metamaterials and liquid crystals, more specifically, cholesteric liquid crystals. Notably, embodiments of the present disclosure may be formed as layers and may be readily incorporated into conventional devices, such as photovoltaic devices, to enhance performance.

BRIEF DESCRIPTION OF THE DRAWINGS

Embodiments of the present disclosure will now be described with reference to the accompanying drawings in which.

In the figures, like reference numerals refer to like parts.

Embodiments of the present disclosure relate to effects achieved with optical radiation. The term "optical" and "light" are used herein to refer to visible, near- and mid-infrared wavelengths. That is, electromagnetic radiation in the range 350 nm to 8 micrometres.

Embodiments also relate to photovoltaic devices but it may be understood from the following detailed description that the optical diode in accordance with the present disclosure may be suitable for a whole range of applications in which one way transmission and/or one way reflection of light is beneficial.

Embodiments also relate to metamaterials or liquid crystals but it can also be understood from the following detailed description that the optical diode in accordance with the present disclosure may be formed from other non-metamaterial or liquid crystal components such as commercially available polarisers and polarising beam splitters having the functionality described.

DETAILED DESCRIPTION OF THE DRAWINGS

In overview, there is provided an optical diode which is transmissive to one circular polarisation but reflective to the opposite circular polarisation. That is, the optical diode transmits one circular polarisation but reflects the other circular polarisation. Embodiments take advantage of the phenomenon that circular polarised light reverses its polarisation upon reflection. That is, for example, a reflection causes right-handed circularly polarised light to become left-handed circularly polarised light. Advantageous embodiments, achieve enhanced absorption of light in a photovoltaic material by utilizing a metamaterial structure that allow non-reciprocal transmission of light. In further advantageous embodiments, the metamaterial structure is formed from cholesteric liquid crystals (CLCs).

CLCs consist of liquid crystal molecules that form helical and periodic structures along a certain direction in space. The pitch of a CLC's helix can be adjusted in order to reflect circularly polarized light propagating along its axis within a certain frequency range, which is typically in order of the hundreds of nanometers. This interesting property of CLCs can be utilized to fabricate tunable optical diodes. The inventors have taken advantage of this concept to achieve significant enhancements.

Figure 1:
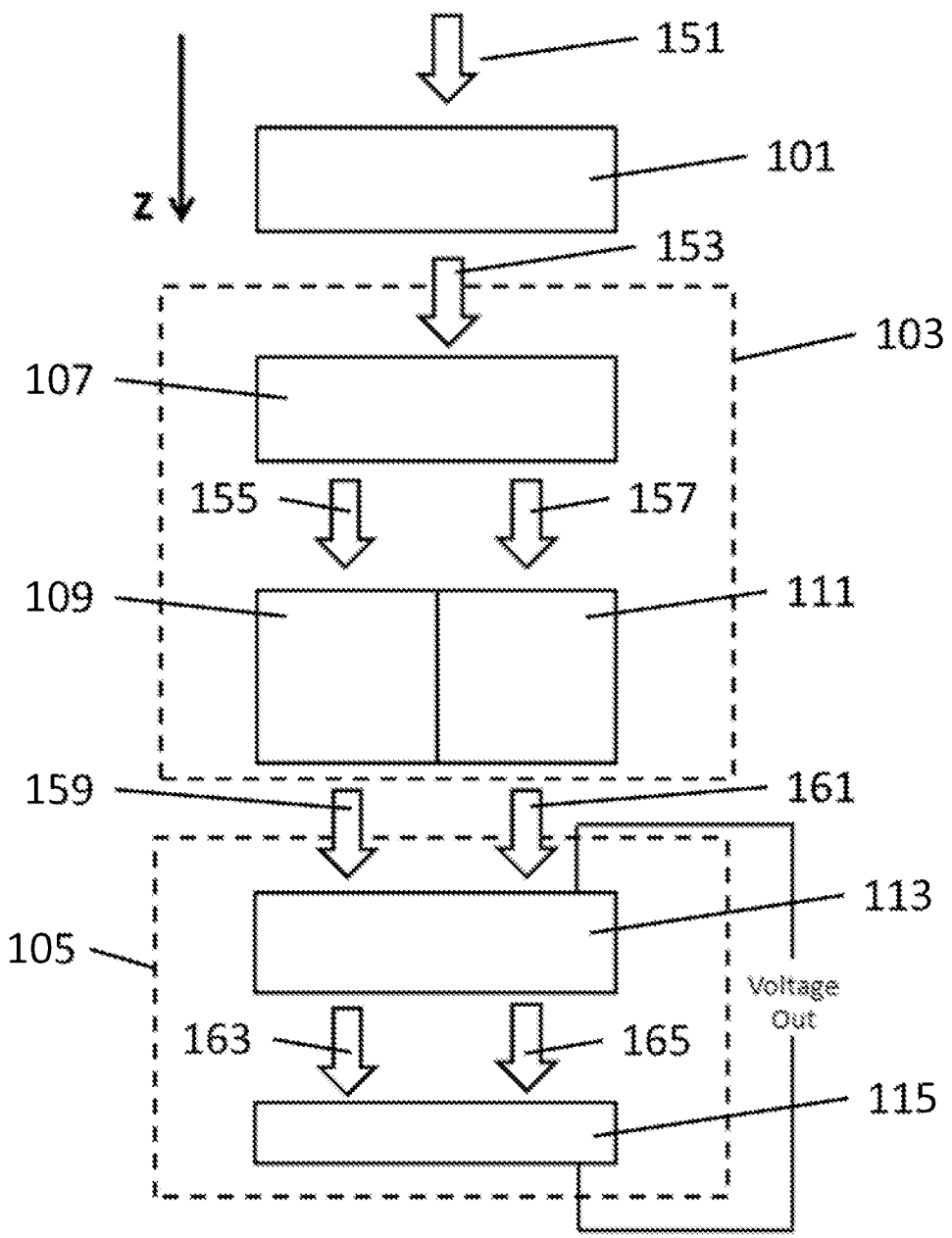
FIG. 1 shows a schematic layout of an optical diode and photovoltaic device in accordance with the present disclosure.

FIG. 1 shows a device comprising the optical diode in accordance with the present disclosure.

In more detail, FIG. 1 shows the ordered arrangement of the following components on a common optical axis: an antireflection coating 101; an optical diode 103 in accordance with the present disclosure; and a photovoltaic device 105. The optical diode 103 comprises a circular polarisation splitter 107 having an input aligned with the antireflection coating 101. The optical diode 103 further comprises a right-hand circular polariser 109 aligned with a first output of the circular polarisation splitter 107 and a left-hand circular polariser 111 aligned with a second output of the circular polarisation splitter 107. The photovoltaic device 105 comprises a photovoltaic or absorbing material 113 aligned with the output of the right-hand circular polariser 109 and the output of the left-hand circular polariser 111. The solar cell further comprises a reflector 115 aligned with an output of the photovoltaic material 113. The reflector 115 reflects all polarisations of light.

In operation, the antireflection coating 101 is arranged to receive first light 151 such as unpolarised light, for example, solar light. The antireflection coating 101 outputs second light 153.

The optical diode 103 has an input and two outputs. The input of the optical diode is positioned to receive the second light 153. More specifically, the circular polarisation splitter 107 of the optical diode 103 receives the second light 153. The circular polarisation splitter 107 spatially separates the second light 153 into right-handed circular polarised (RCP) light 155 and left-handed circular polarised (LCP) light 157. More specifically, the circular polarisation splitter 107 outputs the RCP light 155 on a first optical path and the LCP light 157 on a second optical path.

The RCP light 155 is received by the right-handed circular polariser 109. The right-handed circular polariser 109 is arranged to transmit right-handed circular polarised light and reflect left-handed circular polarised light. The right-handed circular polariser 109 therefore transmits second RCP light 159 which forms a first output of the optical diode 103.

The LCP light 157 is received by the left-handed circular polariser 111. The left-handed circular polariser 111 is arranged to transmit left-handed circular polarised light and reflect right-handed circular polarised light. The left-handed circular polariser 111 therefore transmits second LCP light 161 which forms the second output of the optical diode 103.

The second RCP light 159 and second LCP light 161 are received by the photovoltaic material 113 which is the photoactive component of the photovoltaic device 105. Any light not absorbed by the photovoltaic material 113—namely, third RCP light 163 and third LCP light 165—undergoes a first reflection at reflector 115. The first reflection sends the light back into the photovoltaic material 113 where further absorption may occur as the light makes a second pass through the photovoltaic material 113. However, not all light on the second pass is absorbed by the photovoltaic material 113. In this case, the light will pass through the photovoltaic material 113 and reach the optical diode 103 again.

The components are optically aligned such that any of the second RCP light 159 which is reflected by the reflector 115 (the first reflection), and not absorbed by the photovoltaic material 113 after the second pass, is received by the right-handed circular polariser 109. Likewise, the components are optically aligned such that any of the second LCP light 161 which is reflected by the reflector 115, and not absorbed by the photovoltaic material 113 after the second pass, is received by the left-handed circular polariser 111.

Notably, the sense of circular polarisation of circularly polarised light is reversed by an ordinary reflection. Therefore, the third RCP light 163 becomes left-handed circular polarised light after the first reflection. Any of this light which passes once more through the photovoltaic material 113 is therefore reflected by the right-handed circular polariser 109 (i.e. it undergoes a second reflection) because the right-handed circular polariser 109 reflects left-handed circular polarised light. Therefore a portion of the RCP light 159 makes a third pass through the photovoltaic material 113. In fact, it may be understood that a portion of the RCP light 159 may actually make a fourth pass through the photovoltaic material 113 following a third reflection at the reflector 115.

Likewise, the third LCP light 165 becomes a right-handed circular polarised light after the first reflection. Any of this light which passes once more through the photovoltaic material 113 is therefore reflected by the left-handed circular polariser 111 (i.e. it undergoes a second reflection) because the left-handed circular polariser 111 reflects right-handed circular polarised light. Therefore a portion of the LCP light 161 makes a third pass through the photovoltaic material 113. In fact, it may be understood that a portion of the LCP light 161 may actually make a fourth pass through the photovoltaic material 113 following a third reflection at the reflector 115.

There is therefore provided an optical diode comprising: a circular polarisation splitter arranged to receive at least partially unpolarised light and output right-handed circular polarised light along a first optical path and left-handed circular polarised light along a second optical path; a first circular polariser arranged on the first optical path, wherein the first polariser is arranged to transmit right-handed circular polarised light and reflect left-handed circular polarised light; and a second circular polariser arranged on the second optical path, wherein the second polariser is arranged to transmit left-handed circular polarised light and reflect right-handed circular polarised light.

It can therefore be understood that the optical diode functions to redirect light, which would otherwise escape the system, back into the photovoltaic material. Accordingly, more of the first light 151 is converted into current and then a voltage by the photovoltaic material. Looking at this another way, the effective path length of the photovoltaic material is increased because some light may make third and fourth passes through the photovoltaic material. Therefore, the efficiency of a photovoltaic device may be increased.

In summary, an LCP wave is incident upon the entrance of the device. For example, the wave may be propagating along the direction at 600 nm. Provided that the optical diode is transmissive to left-handed circular polarised light, this wave will almost fully transmit through the device, and will appear at its exit with the same polarization sense (i.e. an LCP wave). Depending on the absorption strength of the photovoltaic material after the optical diode, a fraction of the transmitted power will be absorbed, while the rest will reflect off the reflector at the end of the device. The reflector will invert the sense of polarization of the wave, creating an RCP wave that propagates in the opposite direction. Again, a significant fraction of the reflected wave will be absorbed by the photovoltaic material as it propagates towards the optical diode. However, the RCP wave will now perceive the optical diode as a reflector, and most of the power will be reflected back into the photovoltaic material.

Figure 2:
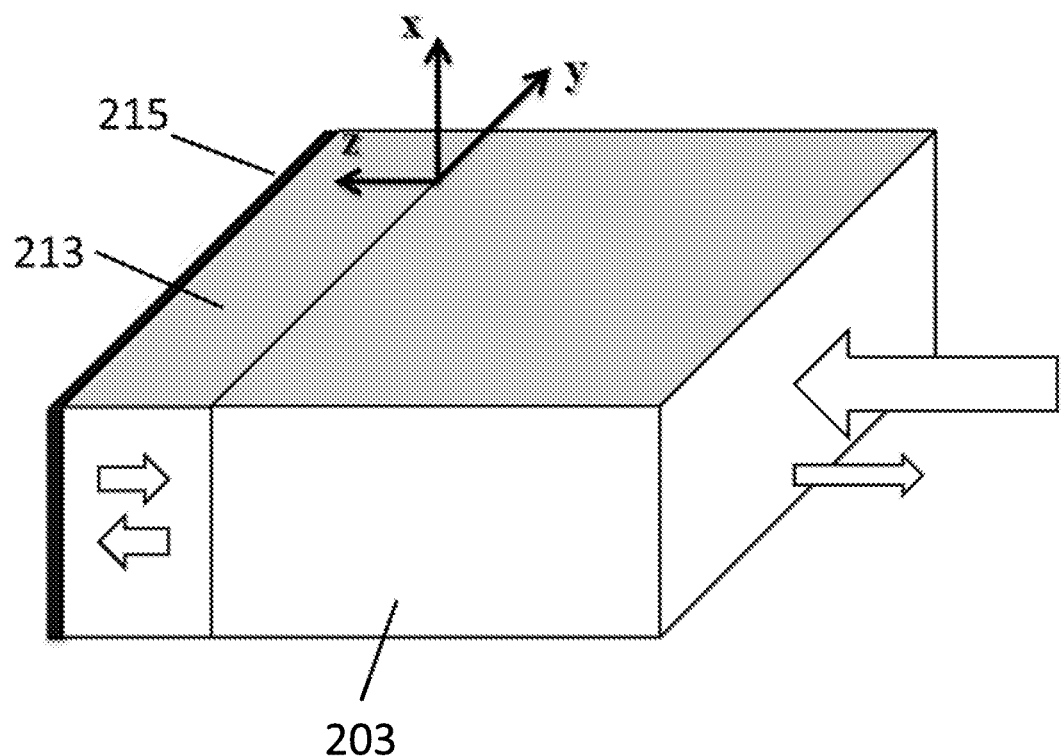
FIG. 2 is a schematic of a planar photovoltaic device including an optical diode in accordance with embodiments.

A further schematic of a device in accordance with embodiments is shown in FIG. 2 in which a solar cell material (absorber region) 213 is sandwiched between a reflector 215 and an optical diode 203, where in this example consists of a layer of a metamaterial—for example, cholesteric liquid crystal (CLC) with its pitch tuned to block a certain wavelength range.

From the foregoing, it may be understood that the anti-reflection coating is optional. In another embodiment, the incident unpolarised light is incident directly on the optical diode 103, 203.

In embodiments, the polarisers comprise a material—such as a metamaterial or liquid crystal geometry—that, unlike ordinary reflection, does not invert the sense of polarisation on reflection. In these embodiments, the RCP wave has to retain its polarization sense again after reflection from the optical diode for causality reasons, as the system is linear and passive. After this second round of absorption, most of the remaining energy exits the device. This significantly increases the absorbed energy, compared to the device being present in free space without the optical diode in accordance with the present disclosure.

In an embodiment, the polarisers and/or polarisation splitter are formed from metamaterials. That is, in embodiments at least one of the circular polarisation splitter, first circular polariser and second circular polariser comprise an optical metamaterial, wherein the optical metamaterial comprises a period component having a dimension no greater than a wavelength of the at least partially unpolarised light.

In an embodiment, the periodic component comprises an array of material elements. In further embodiments, the array is two-dimensional. The size of the material elements and/or the spacing of the material elements are, optionally, sub-wavelength. That is, in an embodiment each material element has a first dimension no greater than a wavelength of the at least partially unpolarised light. In an embodiment, the first dimension is between 1 nanometre (nm) and 8 micrometres (μm), optionally, between 1 nm and 100 nm. In an embodiment, the spacing between adjacent material elements is between 1 nanometre (nm) and 8 micrometres (μm), optionally, between 1 nm and 100 nm.

In an embodiment, the material elements are supported by a host medium. For example, the at least one material element may be: at least partially surrounded by the host medium; located in or on a surface of the host medium; and/or at least partially embedded in the host medium. In an embodiment, the host medium is a dielectric such as silicon or silicon dioxide.

In an embodiment, the material elements are plasmonic. That is, in an embodiment, the material elements comprise a material having a negative dielectric permittivity. In an embodiment, the material elements are arranged to resonate at a wavelength of the at least partially unpolarised light.

In an embodiment, the material elements are metallic, optionally, at least one selected from the group comprising: gold, silver and alumina.

In an embodiment, the circular polariser comprising a planar two-dimensional array of material elements made from silver. The material elements are rods and have a width of 20 nm, a length of 100 nm and thickness of 10 nm and adjacent elements are spaced by 50 nm.

However, the skilled person will understand that other sizes and materials may be used to provide the effects disclosed herein. For example, the materials elements may be any plasmonic material at optical frequencies and may have a size of 1-500 nm. Adjacent material elements may be spaced by 5-500 nm. The material elements may be ellipsoids, cuboids, spheres, parallelepipeds, or combinations of these in groups.

In embodiments, a corresponding left-handed circular polariser is formed from the same material elements but rotated In an advantageous embodiment, the material elements are elongate and orientated, or "pitched", with respect to each other to provide optical effects. In an embodiment, the material elements are molecules of a liquid crystal. In an embodiment, the metamaterial comprises a cholesteric liquid crystal or array of elongate material elements respectively orientated in a helical configuration. That is, the elongated material elements are rotated about a propagation axis of incident light.

The sense of orientation of the respective material elements determines the sense of polarisation of the polariser. For example, the same material elements may be used to form the left and right handed circular polarisers however the sense of rotation of the elongated elements will differ. For example, the material element may be respectively arranged to form a left-handed helix or a right-handed helix.

In an embodiment, the optical diode comprises cholesteric liquid crystals (CLC). In an embodiment, the CLC is 1.8 μm thick (length in the direction of propagation of the light) with a left handed helix with pitch $p_1$=315 nm. The CLC has an ordinary refractive index of $n_{1o}$=1.50 and an extraordinary index of $n_{1e}$=1.75. The CLC layers may be assumed to have their optical axes (their local director) in the x-y plane, but their orientation depends on their position along the length of the crystal. The uniaxial local tensor in the laboratory coordinate system can be written as:

$$\varepsilon(z) = \begin{pmatrix} \overline{\varepsilon} + \Delta\varepsilon\cos2\varphi & \Delta\varepsilon\sin2\varphi & 0 \\ \Delta\varepsilon\sin2\varphi & \overline{\varepsilon} - \Delta\varepsilon\cos2\varphi & 0 \\ 0 & 0 & n_o^2 \end{pmatrix} \quad (1)$$

Figure 3:
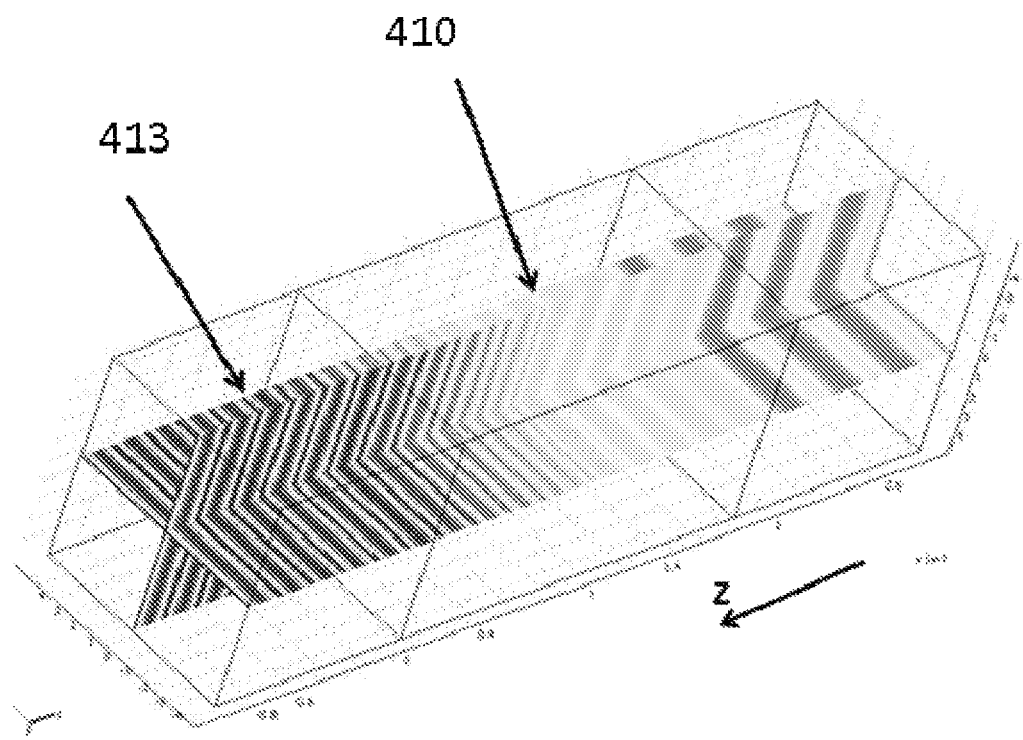
FIG. 3 shows the simulated field distribution in a planar photovoltaic device when right-handed circularly polarised light is incident.

Here $\overline{\varepsilon}=(n_e^2+n_o^2)/2$, $\Delta\varepsilon=(n_e^2-n_o^2)/2$ and $\phi=2\pi(z-z_0)/p$, with $z_0$ the location of the starting edge of the crystal. In this embodiment, the total thickness (length in the direction of propagation of the light) of the optical diode is 1.8 μm and it is aligned with the z-axis of the domain (the direction of propagation of the light). FIG. 3 shows the result of a simulation of the planar device shown in FIG. 2 when the incoming radiation is right-hand circularly polarised. More specifically, FIG. 3 shows the field distribution in the photovoltaic material 413 and a single reflective polariser 410 in accordance with the present disclosure. The incident wavelength is 500 nm in free space, and the absorbing material is modelled with relative permittivity $\varepsilon=3*(1-j\tan\delta)$, with $\tan\delta=0.01$. The circular polarizer consists of cholesteric liquid crystals. In this example the structure is assumed very large compared to the wavelength in the x & y directions (perpendicular to the direction of propagation). The simulation domain includes a 1 μm long section of air for improved visualization of the incoming wave. The absorbing layer is a 1 μm thick material with a relative permittivity equal to $\varepsilon\cdot(1-j\tan\delta)$, where the loss tangent $\tan\delta$ can be varied to simulate materials with different absorption strengths.

In embodiments, the cholesteric liquid crystal is made from hydroxypropyl cellulose or cholesteryl benzoate having a size of 1 μm to 1 mm and a pitch of 100 nm to 8 μm.

In another embodiment, the metamaterial polarisers comprise a mix of cholesteric and nematic liquid crystals. In an advantageous embodiment, the mix is 70-90%—optionally 80%—cholesteric and, correspondingly, 30-10%—optionally, 20%—nematic.

Figure 4:
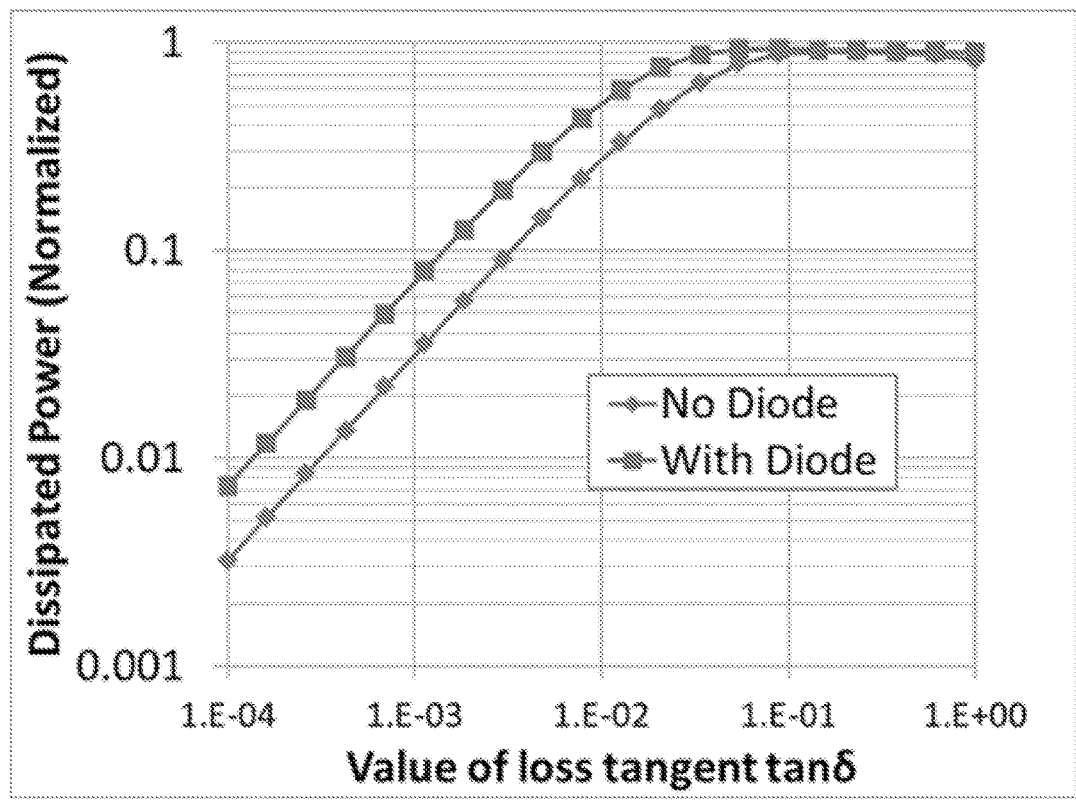
FIG. 4 show a comparison of dissipated power for the simulated structure of FIG. 2 with and without the optical diode according to the present disclosure.

The inventors have found that the optical diode in accordance with the present disclosure significantly increases the absorbed energy, compared to the device being present in free space without the optical diode. Some example results are shown in FIGS. 3 and 4, where it may be seen that, except for very lossy materials, the introduction of the optical diode doubles the amount of energy that is absorbed by the material. This scheme is broadband and thus ideal for existing photovoltaic devices—in particular, semiconductor solar cells—which suffer from weak absorption over a significant portion of the electromagnetic spectrum.

In other embodiments, the optical diode comprises a plurality of layers of metamaterials. In embodiments, the optical diode is applied to more complicated systems that consist of a plurality of photovoltaic or absorbing later which, optionally, comprise many different materials. In such cases the optical diode in accordance with the present disclosure, when placed immediately after an existing photovoltaic arrangement, enhances absorption efficiency.

In an embodiment, the optical diode comprises a metamaterial comprising multiple layers of cholesteric liquid crystals. Advantageously, the optical metamaterial is substantially planar. Accordingly, a layered device may be formed and layering techniques may be used for fabrication. Further advantageously, a planar optical diode may be readily coupled with existing photovoltaic devices. Notably, in embodiments, the optical diode is passive. That is, it does not require an external power source or control systems.

In advantageous embodiments, it may be understand that the first optical path is substantially parallel to the second optical path.

FIG. 1 shows an embodiment comprises two circular polarisers. However, the skilled person will recognise that the optical diode is equally suitable to increase efficiency of circularly polarised light. That is, in embodiments, the optical diode operates for one kind of circular polarization only.

There is therefore provided an optical diode comprising: a circular polarisation splitter arranged to receive at least partially unpolarised light and output right-handed circular polarised light along a first optical path and left-handed circular polarised light along a second optical path; and a circular polariser arranged on the first optical path, wherein the first polariser is arranged to transmit one sense of circularly polarised light and reflect the other sense circularly polarised light.

However, in advantageous embodiments—such as that shown in FIG. 1—in order to provide enhancement independent of the polarization of the incident light, a second optical diode (but with inverted orientation compared to the first one) should be placed next to existing one (transversely to the direction of propagation of incident light). Incoming unpolarized light can be first split into left and right circular polarizations before reaching each diode, using a device such as a cycloidal diffractive waveplate (CDW). That is, in an embodiment, the circular polarisation splitter is formed from a cycloidal diffractive waveplate. However, the skilled person will understand that other circular polarisation splitters may be equally suitable. This device, which can also be made of cholesteric liquid crystals, has the ability to split unpolarized light into two beams of opposite circular polarizations, which also exit at different locations after the CDW. This principle enhances the absorption efficiency for both polarizations, and thus also unpolarized light.

In embodiments, the CDW comprises liquid crystal molecules which are rotated along a plane perpendicular to the direction of light propagation, i.e. the optical axis of the molecules rotates in the plane of the layer of material elements. In an embodiment, the molecules comprise ellipsoidal molecules of liquid crystal materials such as azobenzene or cinnamates. The thickness of the layer is typically between 10 nm to 10 µm, and it is usually smaller than the spatial period of the orientation pattern. In embodiments, the CDW is made using techniques such as photographic photoalignment.

The optical diode in accordance with the present disclosure may be readily incorporated in a photovoltaic device and retrofitted into existing photovoltaic devices. It can be understood that there is therefore also provided a photovoltaic device comprising: the optical diode according to the present disclosure; a photovoltaic material arranged to receive light on the first and second optical paths; and a reflective element arranged to receive light transmitted by the absorbing element and redirect that light back towards the optical diode.

The skilled person will understand that any photovoltaic component may be suitable in accordance with the present disclosure. For example, in an embodiment, the photovoltaic component is formed of at least one selected from the group comprising silicon, germanium, gallium arsenide and silicon carbide. In other embodiments, the photovoltaic component is cadmium telluride or copper indium gallium selenide/sulphide. It can be understood from the present disclosure that other semiconductors may be equally suitable.

Figure 5:
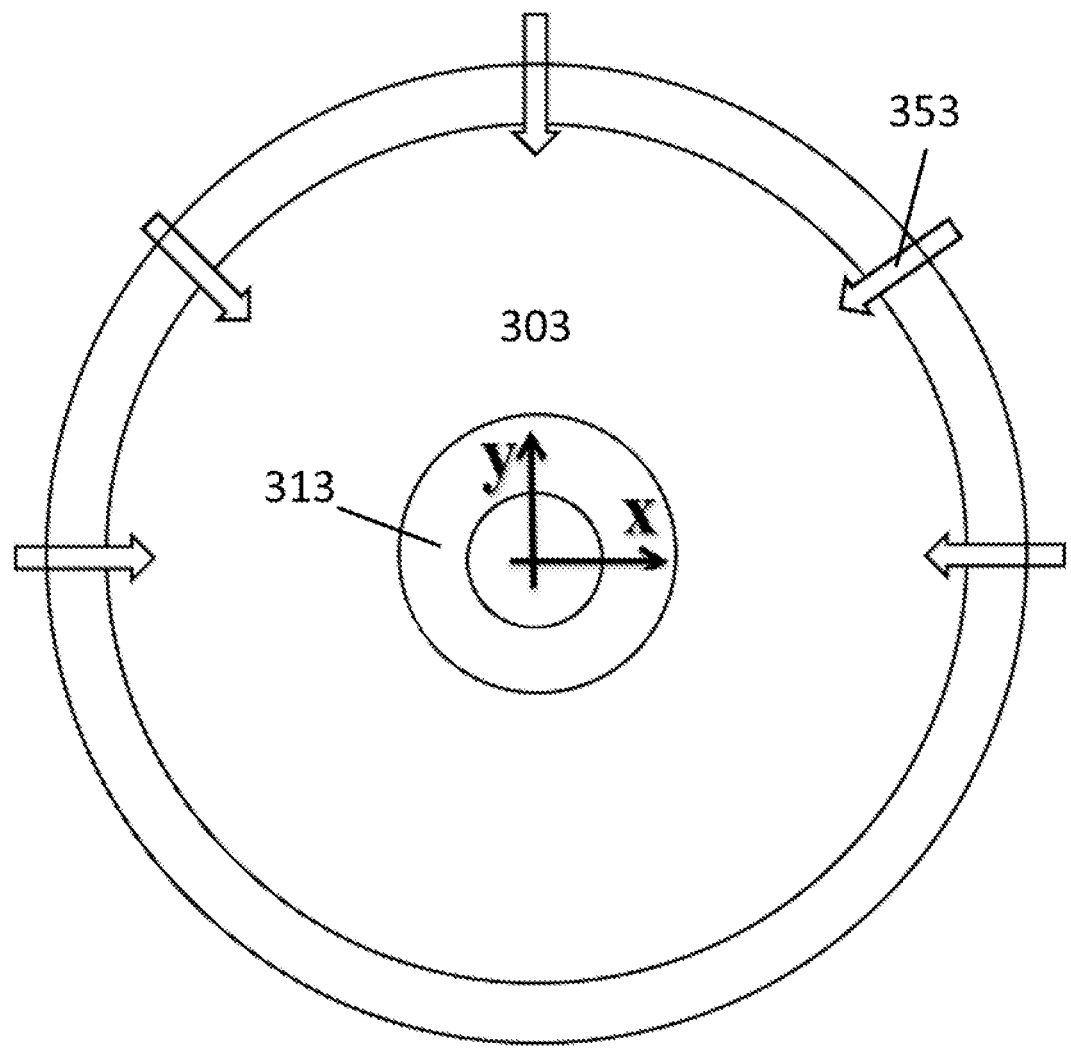
FIG. 5 shows a cylindrical photovoltaic device in accordance with embodiments.

FIG. 5 shows an embodiment in which the photovoltaic device 303 is arranged in a cylindrical geometry.

The device of FIG. 5 has azimuthal symmetry and may be formed by rotating the one-dimensional device of FIG. 2 by 360° around its edge (the point where the left edge of the reflector is located). Inward propagating, circularly polarized cylindrical waves 353 may be directed perpendicularly to the surface of the device, i.e. they are described at the impinging surface by the expression $$\vec{E} = (\hat{\theta} \pm j\hat{z})e^{+jkr} \qquad (2)$$

Here $\hat{\theta}$ is the unit vector tangential to the outer surface of the device and $\hat{z}$ is perpendicular to the x-y plane and out of the page.

The crystal director in this case lies in the θ plane of the laboratory frame. The dielectric tensor of each CLC layer is calculated in the laboratory frame after applying two rotations. The first is the rotation along the radial length of the diode by an angle $\phi(r) = 2\pi(r-r_0)/p$. The length of each diode is now measured along the r direction instead along the z direction. The second rotation occurs in the x-y plane by an angle $\theta = \tan^{-1}(y/x)$. Thus, the expression for the permittivity tensor for the CLC layer is given by $$\varepsilon(r,\theta) = \begin{pmatrix} n_o^2 + \Delta\varepsilon\sin^2\varphi\sin^2\theta & \Delta\varepsilon\cos\theta\sin\theta\cos^2\varphi & \Delta\varepsilon\cos\theta\sin\varphi\sin\theta \\ \Delta\varepsilon\cos\theta\sin\theta\cos^2\varphi & n_o^2 + \Delta\varepsilon\cos^2\theta\sin^2\varphi & -\Delta\varepsilon\cos\theta\sin\varphi\cos\varphi \\ \Delta\varepsilon\cos\theta\sin\varphi\sin\theta & -\Delta\varepsilon\cos\theta\sin\varphi\cos\varphi & n_o^2 + \Delta\varepsilon\cos^2\varphi \end{pmatrix} \qquad (3)$$

Along the z direction the device can be extended arbitrarily, or alternated with a similar device but with opposite handedness for the diode/polarizer, so that waves of the opposite polarization are absorbed. This pair of diodes, coupled with a proper circular polarization splitter (as indicated in FIG. 1) can absorb all incident polarizations.

It may therefore be understood that, in an embodiment, the reflective element is cylindrical and the photovoltaic material 313 and optical diode 303 are arranged as cylindrical layers around the reflective element.

In an embodiment, the photovoltaic device is a solar cell.

The optical diode, metamaterials and/or liquid crystals in accordance with the present disclosure may be fabricated by electron beam lithography, focused ion beam lithography, lift-off processes, or other lithographic techniques. These techniques may be used to form the components having the sub-wavelength parameters and characteristics disclosed herein.

Although embodiments relate to circular polarisation—including circular polarisers and circular polarisation beam splitters—it may be understood that embodiments of the present disclosure may be equally applicable elliptical radiation. Likewise, the present disclosure is equally applicable to metamaterials arranged to provide elliptical or linear polarisation or polarisation beam splitting, as defined herein. That is, in an embodiment, there is provided an optical diode comprising: a polarisation splitter arranged to receive at least partially unpolarised light and output first polarised light along a first optical path and second polarised light along a second optical path; a first polariser arranged on the first optical path, wherein the first polariser is arranged to transmit first polarised light and reflect second polarised light and wherein the first polariser is a metamaterial.

Advantageously, the optical diode and photovoltaic device in accordance with embodiments may be used as an add-on component existing types of solar panels or photovoltaic cells. In particular, the system can be retrofitted in existing photovoltaic devices such as solar panels. The system is passive, i.e. it does not require an external power source or an active control system.

Although aspects and embodiments have been described, variations can be made without departing from the inventive concepts disclosed herein.

The invention claimed is:

1. An optical diode comprising:
a circular polarisation splitter arranged to receive at least partially unpolarised light and output right-handed circular polarised light along a first optical path and left-handed circular polarised light along a second optical path;
a first circular polariser arranged on the first optical path, wherein the first polariser is arranged to transmit right-handed circular polarised light and reflect left-handed circular polarised light; and
a second circular polariser arranged on the second optical path, wherein the second polariser is arranged to transmit left-handed circular polarised light and reflect right-handed circular polarised light.

2. An optical diode as claimed in claim 1 wherein at least one of the circular polarisation splitter, first circular polariser and second circular polariser comprise an optical metamaterial, wherein the optical metamaterial comprises a period component having a dimension no greater than a wavelength of the at least partially unpolarised light.

3. An optical diode as claimed in claim 2 wherein the periodic component comprises an array of material elements, optionally, wherein the array is a two-dimensional array.

4. An optical diode as claimed in claim 3 wherein the material elements are plasmonic.

5. An optical diode as claimed in claim 3 wherein the material elements comprise a material having a negative dielectric permittivity.

6. An optical diode as claimed in claim 3 wherein the material elements are metallic, optionally, at least one selected from the group comprising: gold, silver and alumina.

7. An optical diode as claimed in claim 3 wherein the material elements are arranged to resonate at a wavelength of the at least partially unpolarised light.

8. An optical diode as claimed in claim 3 wherein each material element has a first dimension no greater than a wavelength of the at least partially unpolarised light.

9. An optical diode as claimed in claim 8 wherein the first dimension is between 1 nanometre (nm) and 8 micrometres ($\mu$m).

10. An optical diode as claimed in claim 3 wherein the spacing between adjacent material elements is between 1 nanometre (nm) and 8 micrometres ($\mu$m).

11. An optical diode as claimed in claim 3 wherein the material elements are supported by a host medium.

12. An optical diode as claimed in claim 11 wherein at least one material element is at least partially surrounded by the host medium.

13. An optical diode as claimed in claim 11 wherein at least one material element is located in or on a surface of the host medium.

14. An optical diode as claimed in claim 11 wherein at least one material element is at least partially embedded in the host medium.

15. An optical diode as claimed in claim 11 wherein the host medium is a dielectric.

16. An optical diode as claimed in claim 3 wherein the material elements are elongate.

17. An optical diode as claimed in claim 3 wherein the material elements are molecules of a liquid crystal.

18. An optical diode as claimed in claim 17 wherein the molecules are respectively orientated to form a cholesteric or helical arrangement.

19. An optical diode as claimed 18 wherein the molecules are rotated about a propagation axis of incident light.

20. An optical diode as claimed in claim 17 wherein the material elements are a mixture of cholesteric liquid crystals and nematic liquid crystals, optionally, 80% cholesteric-20% nematic.

21. An optical diode as claimed in claim 2 wherein the metamaterial comprises multiple layers of cholesteric liquid crystals.

22. An optical diode as claimed in claim 2 wherein the optical metamaterial is substantially planar.

23. An optical diode as claimed in claim 1 wherein the optical diode is passive.

24. An optical diode as claimed in claim 1 wherein the first optical path is substantially parallel to the second optical path.

25. An optical diode as claimed in claim 1 wherein the circular polarisation splitter is formed from a cycloidal diffractive waveplate.

26. A photovoltaic device comprising:
  the optical diode of claim 1;
  a photovoltaic material arranged to receive light on the first and second optical paths; and
  a reflective element arranged to receive light transmitted by the photovoltaic material and redirect that light back towards the optical diode.

27. A photovoltaic device as claimed in claim 26 wherein the photovoltaic material is at least one selected from the group comprising silicon, germanium, gallium arsenide, silicon carbide, cadmium telluride and copper indium gallium selenide/sulphide.

28. A photovoltaic device as claimed in claim 27 wherein the reflective element is cylindrical and the photovoltaic material and optical diode are arranged as cylindrical layers around the reflective element.

* * * * *